US008134282B1

(12) United States Patent
Churchill et al.

(10) Patent No.: US 8,134,282 B1
(45) Date of Patent: Mar. 13, 2012

(54) WIDE-BAND VIBRATION ENERGY HARVESTER WITH RESTORING SPRING

(75) Inventors: David L. Churchill, Burlington, VT (US); Steven W. Arms, Williston, VT (US); Michael J. Hamel, Essex Junction, VT (US); James Marc Leas, South Burlington, VT (US)

(73) Assignee: Microstrain, Inc., Williston, VT (US)

( * ) Notice: Subject to any disclaimer, the term of this patent is extended or adjusted under 35 U.S.C. 154(b) by 0 days.

(21) Appl. No.: 12/873,801

(22) Filed: Sep. 1, 2010

Related U.S. Application Data

(62) Division of application No. 12/011,702, filed on Jan. 29, 2008, now Pat. No. 7,839,058.

(60) Provisional application No. 60/898,160, filed on Jan. 29, 2007.

(51) Int. Cl.
*H01L 41/113* (2006.01)
(52) U.S. Cl. .................................. 310/339; 310/329
(58) Field of Classification Search .......... 310/329–332, 310/339
See application file for complete search history.

(56) References Cited

U.S. PATENT DOCUMENTS

| 6,995,496 B1* | 2/2006 | Hagood et al. ............... 310/317 |
| 2008/0136292 A1* | 6/2008 | Thiesen ....................... 310/334 |

FOREIGN PATENT DOCUMENTS

WO    WO 2005/036728    *    4/2005

OTHER PUBLICATIONS

Wikipedia article entitled "Buck Converter", Nov. 27, 2006.*

* cited by examiner

*Primary Examiner* — Derek Rosenau
(74) *Attorney, Agent, or Firm* — James Marc Leas

(57) ABSTRACT

A device for harvesting an external source of energy includes an electricity generating device, a flexure, and a restoring spring. The electricity generating device generates electricity based on movement of the flexure. The flexure has a first stable position. When disregarding presence of the restoring spring the flexure also has a second stable position different from the first stable position. The restoring spring is positioned so when the flexure snaps from the first stable position toward the second stable position the restoring spring provides a restoring spring force to restore the flexure toward the first stable position. Substantially greater force is needed to snap the flexure from the first stable position toward the second stable position to overcome the restoring spring force than is required to snap the flexure from the second stable position toward the first stable position.

28 Claims, 12 Drawing Sheets

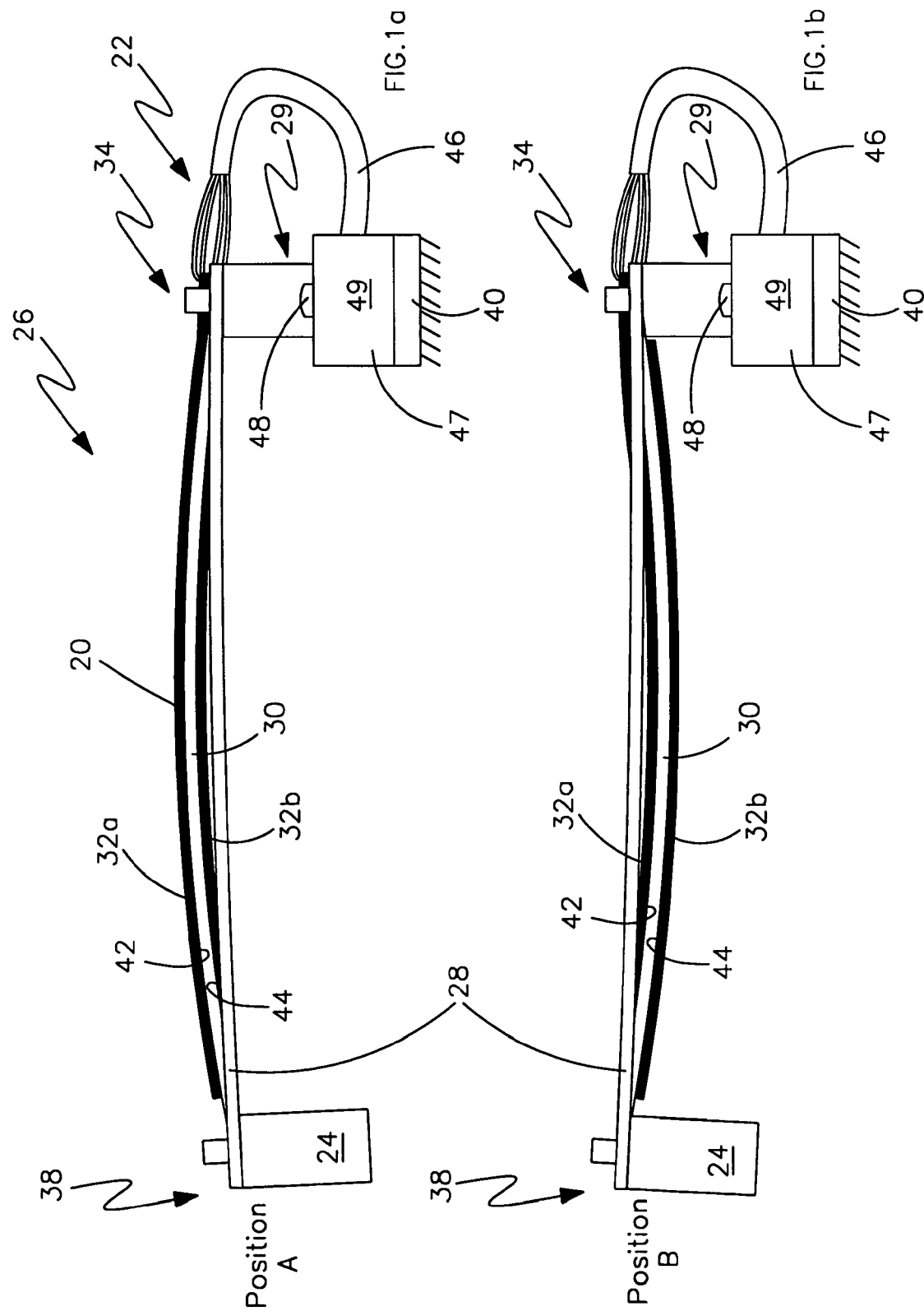

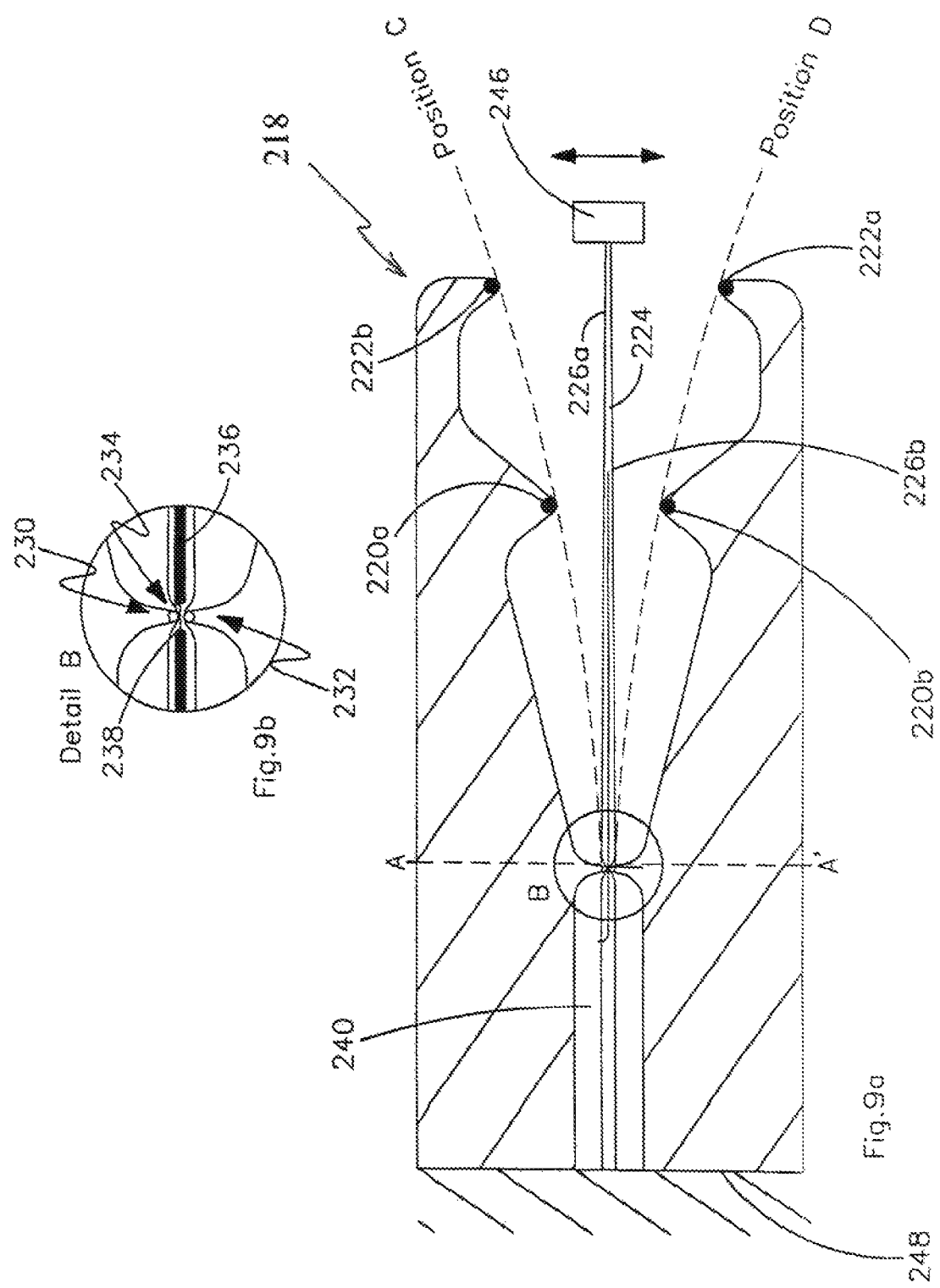

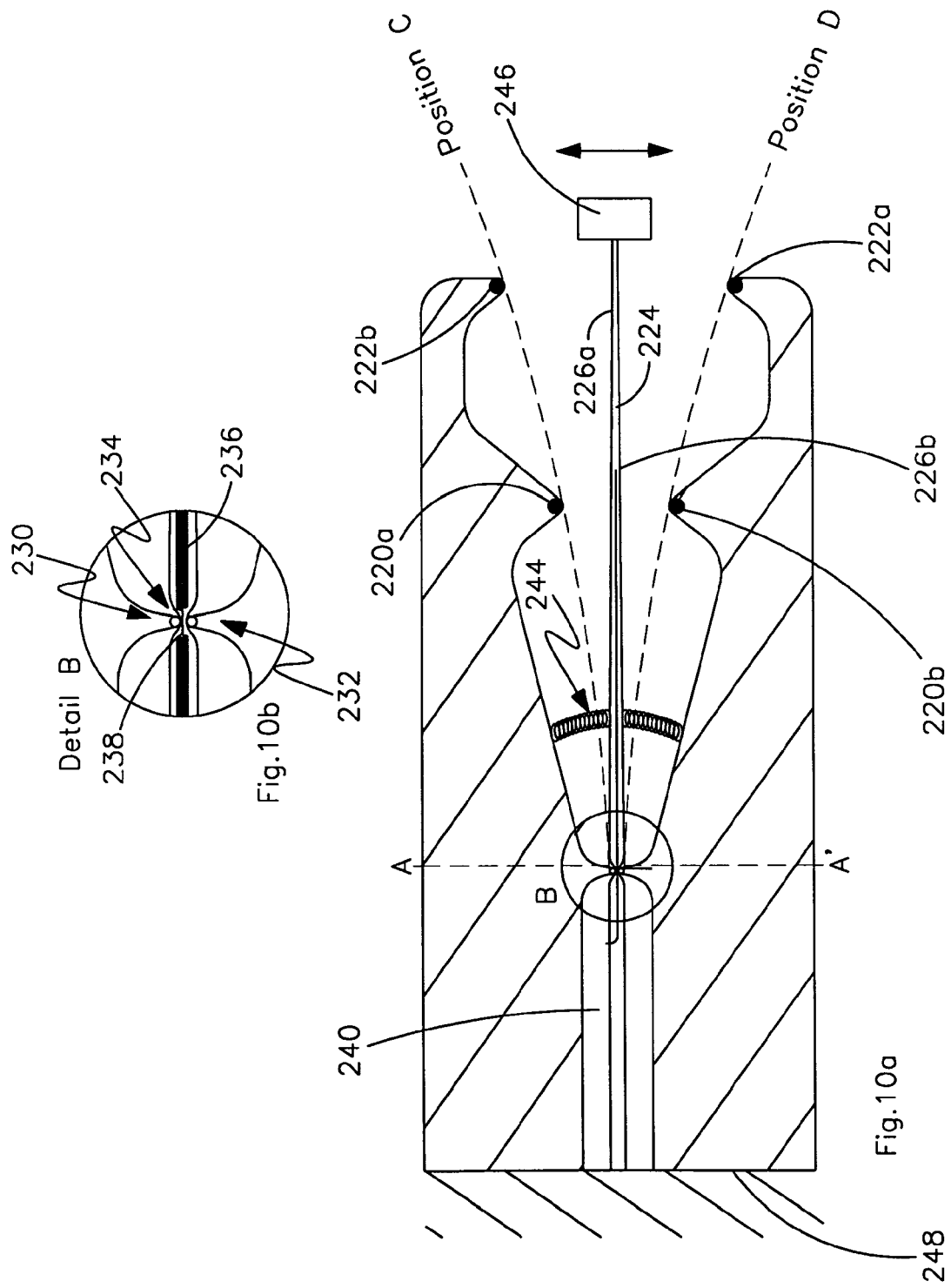

WIDE-BAND VIBRATION ENERGY HARVESTER WITH RESTORING SPRING

RELATED APPLICATIONS AND PRIORITY

This application is a divisional of U.S. patent application Ser. No. 12/011,702, filed Jan. 29, 2008 now U.S. Pat. No. 7,839,058, incorporated herein by reference. This application claims priority of Provisional Patent Application 60/898,160, filed Jan. 29, 2007, incorporated herein by reference.

This application is related to the following commonly assigned patent applications:

"Energy Harvesting for Wireless Sensor Operation and Data Transmission," U.S. Pat. No. 7,081,693 to M. Hamel et al., filed Mar. 5, 2003 ("the '693 patent").

"Shaft Mounted Energy Harvesting for Wireless Sensor Operation and Data Transmission," U.S. Pat. No. 7,256,505 to S. W. Arms et al., filed Jan. 31, 2004 ("the '505 patent").

"Slotted Beam Piezoelectric Composite," U.S. Pat. No. 7,692,365 to D. L. Churchill, filed Nov. 24, 2006, ("the '365 patent").

"Energy Harvesting, Wireless Structural Health Monitoring System," U.S. Pat. No. 7,719,416 to S. W. Arms et al., filed Sep. 11, 2006 ("the '416 patent").

"Sensor Powered Event Logger," U.S. Pat. No. 7,747,415 to D. L. Churchill et al., filed Dec. 22, 2006 ("the '415 patent").

"Integrated Piezoelectric Composite and Support Circuit," U.S. Pat. No. 7,646,135 to D. L. Churchill et al., filed Dec. 22, 2006 ("the '135 patent").

"Heat Stress, Plant Stress and Plant Health Monitor System," US Patent Application 2008-0074254 to C. P. Townsend et al., filed Sep. 7, 2007 ("the '254 application").

"A Capacitive Discharge Energy Harvesting Converter," U.S. Pat. No. 7,781,943 to M. J. Hamel & D. L. Churchill, filed Jan. 23, 2008 ("the '943 patent").

All of the above listed patents and patent applications are incorporated herein by reference.

BACKGROUND

The vibration energy harvesting beam described in the '365 patent attempts to maximize the strain of bonded piezoelectric patches and maximize the electrical output by providing a slotted, tapered vibrating beam that places the piezoelectric patches away from the neutral axis of the beam. Such a vibrating beam is especially useful when the ambient vibration level is low and if the vibrating beam may be tuned to be resonant at the predominant frequency present in the instrumented component, machine, or structure to which it is mounted. Such an energy harvester was tuned to generate electricity to power a wireless temperature and humidity sensing node from ambient vibration, as described in the '254 application.

However, in many cases the ambient vibration level may be much higher but the predominant frequency may be inconsistent or unpredictable. For example, aboard helicopters the predominant vibration frequency may be the rotational rate of the rotor assembly times the number of rotor blades in the assembly. Thus, the structure of the Sikorsky H-60 helicopter, which has four rotor blades and has a typical rotational rates of about 4.3 Hz has a predominant vibration frequency of about 16-17 Hz. The G levels have been reported to vary significantly with location from about 1 to about 5 G's. Other rotating structures on this helicopter experience fundamental vibration frequencies that may be lower, such as the pitch links or control rods, which vibrate with the rotational rate of the rotor assembly of about 4.3 Hz, but which also contain higher frequency components. What is needed is an energy harvester design that will generate electricity efficiently under a wide range of vibration amplitudes and frequencies.

SUMMARY

One aspect of the present patent application is a device that includes a piezoelectric flexure and a restoring spring. The piezoelectric flexure has a first stable position and a second stable position. The restoring spring is positioned so when the piezoelectric flexure snaps from the first stable position toward the second stable position the restoring spring acts to restore the piezoelectric flexure to the first stable position.

BRIEF DESCRIPTION OF THE DRAWINGS

FIGS. 1a, 1b are side views of one embodiment of a wideband energy harvester with a composite cantilever beam that includes a piezoelectric flexure and length-constraining elements located adjacent the piezoelectric flexure that allow the composite cantilever beam to snap between two stable positions;

FIG. 9a is another embodiment of a compliant vibration harvester with discrete end stops to prevent overload and provides a point that introduces curvature in the piezoelectric flexure;

FIG. 9b is another embodiment of a compliant piezoelectric flexure with a mechanical pivot that allows the piezoelectric flexure to be highly compliant, allowing it to oscillate at a wide range of frequencies;

FIGS. 10a, 10b are an embodiment of the compliant vibration harvester of FIGS. 9a, 9b with springs to counter the force of gravity;

DETAILED DESCRIPTION

As described in the '693 patent:

Numerous sources of ambient energy can be exploited for energy harvesting, including solar, wind, thermoelectric, water/wave/tide, rotation, strain, and vibration. For shipboard monitoring applications below deck and for monitoring tire pressure and temperature, mechanical energy harvesting devices, such as those that harvest strain or vibrational energy are preferred. In Navy applications, strain energy would be available on engine mounts, ship hull sections, and structural support elements. Vibrational energy would be available on diesel turbine engine components, propeller shaft drive elements, and other machinery and equipment. This energy could be harvested using electromagnetic devices (coil with permanent magnet), Weigand effect devices, and piezoelectric transducer (PZT) materials. Of these, the PZT materials hold the most promise.

In one embodiment of the present patent application a flexure element is used that is mechanically bi-stable. Piezoelectric flexure 20 of energy harvester 22 is stable at two extremes of its motion, as shown in FIGS. 1a, 1b. During the transition in-between these two stable extremes piezoelectric flexure 20 "snaps" suddenly from stable position A to stable position B.

If enough inertial load is provided to mass 24 piezoelectric flexure 20 will snap between stable positions A and B at a wide range of ambient load frequencies or vibration frequencies. Energy harvester 22 may be considered to be "wideband" since it is capable of efficiently producing electrical energy at a wide range of ambient vibration frequencies. The range can be tailored by adjusting mass, stiffness of the piezoelectric flexure and its dimensions. It can even efficiently generate electricity with a single event provided the single events provide enough force to cause the piezoelectric flexure to snap to the other stable position. In another embodiment it can be combined with a tuned cantilever harvester to provide features of both.

Figure 2A:
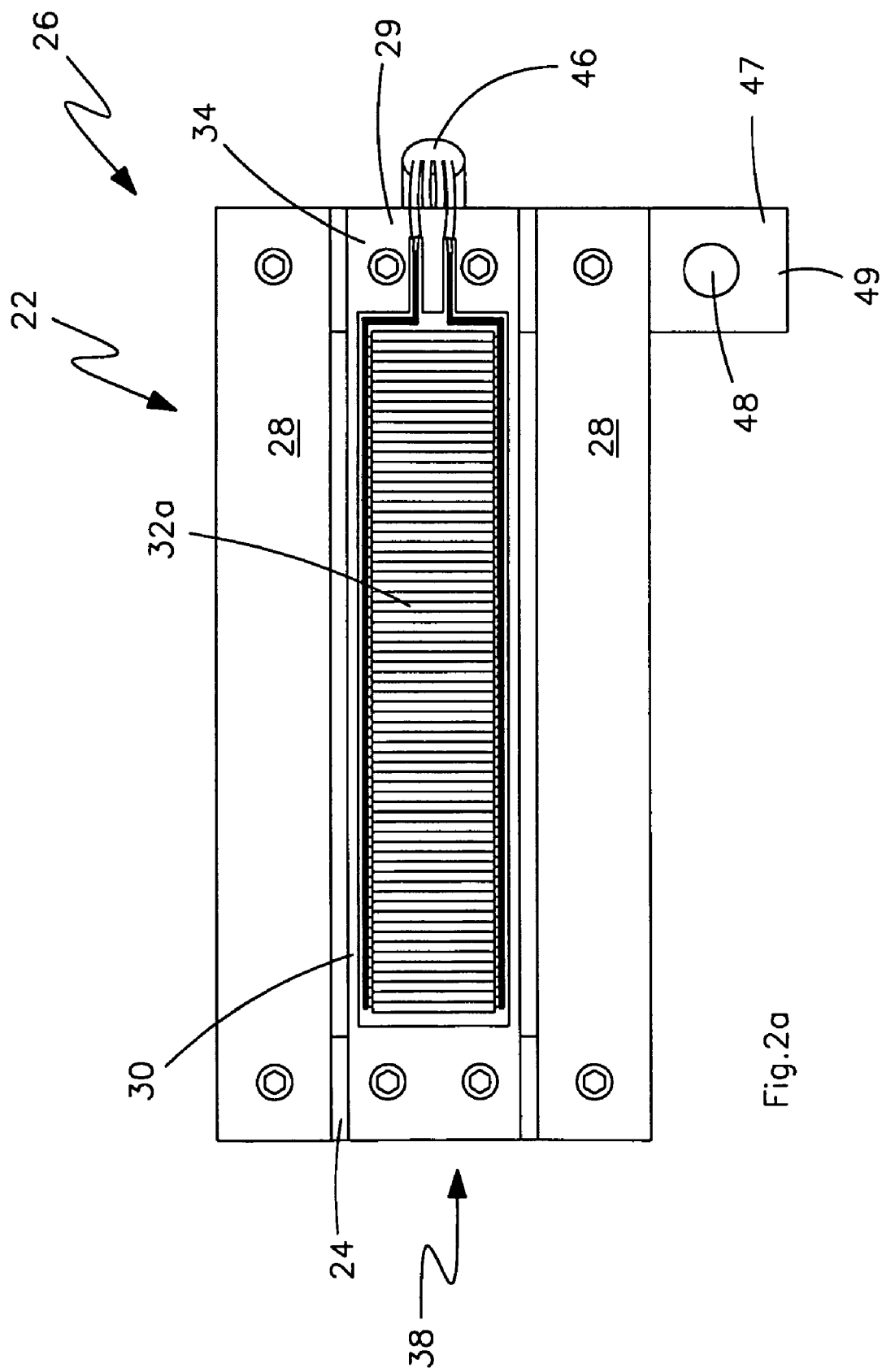
FIG. 2a is a top view of the wideband energy harvester shown in FIGS. 1a, 1b.

The sudden change in position of piezoelectric flexure 20 from position A to B occurs because piezoelectric flexure 20 is under compressive pre-loading to create a curvature in piezoelectric flexure 20. In this embodiment, piezoelectric flexure 20 generates electrical energy when this curvature is reversed based on the applied mechanical energy from vibration or load to the machine or structure to which it is attached. In one embodiment, composite cantilever beam 26 includes piezoelectric flexure 20, length-constraining elements 28 located adjacent piezoelectric flexure 20, and mass 24, as shown in FIGS. 1a, 1b, and in FIG. 2.

In this embodiment piezoelectric flexure 20 is longer than adjacent length-constraining elements 28. Because they are shorter and mounted between the same support structure 29 and mass 24, length-constraining elements 28 put piezoelectric flexure 20 under compression, causing piezoelectric flexure 20 to curve. When mass 24 is subjected to a sufficient load from either a directly applied force or from an acceleration due to vibration input, piezoelectric flexure 20 moves from one stable curved position to another. Length-constraining elements 28 are momentarily stretched during the transition. Thus, as mass 24 was deflected away from stable position A in FIG. 1a, and length-constraining element 28 was stretched, the curvature in piezoelectric flexure 20 rapidly reversed, and piezoelectric flexure 20 "snapped" its shape from convex to concave, as shown in FIG. 1b.

Piezoelectric flexure 20 includes substrate 30 and piezoelectric patches 32a, 32b mounted to substrate 30. End 34 of composite cantilever beam 26 is fixedly mounted to support structure 29 while end 38 of composite cantilever beam 26 includes mass 24. Piezoelectric material called "macro fiber composites" are available from Smart Materials, Inc., (Sarasota, Fla.), and piezoelectric fiber composites are available from Advanced Cerametrics, Inc, (Lambertville, N.J.).

Adjustment of the mechanical compliance of piezoelectric flexure 20 can be made by changing its stiffness or by changing the amount of mass 24. Stiffness of piezoelectric flexure 20 depends on the material of which substrate 30 is made and its cross sectional area, as well as the contribution to stiffness from piezoelectric flexure 20.

In one embodiment, if a more compliant composite cantilever beam 26 is used with the same mass, energy harvester 22 can operate reliably in applications where the vibration amplitude includes lower G levels. The present inventors recognized that substrate 30 and length-constraining elements 28 both contribute to the stiffness of composite cantilever beam 26 and that the stiffness of composite cantilever beam 26 can be adjusted to match the expected vibration or loading amplitude. A softer more compliant composite cantilever beam 26 needs less mass to snap to the other stable position, given the same force. The mass can also be adjusted, with a larger mass delivering more force to composite cantilever beam 26, allowing it to operate at a lower G level.

Support structure 29 moves with vibrating or oscillating component, machine, or structure 40, providing energy to composite cantilever beam 26. Mass 24, connected to free end 38 of composite cantilever beam 26 is free to oscillate when subjected to vibration or movement. When mass 24 is subject to inertial loads or a directly applied force, substrate 30 suddenly snaps from stable position A to new stable position B, because these two positions represent the lowest energy state for substrate 30 with mass 24. Substrate 30 may be constructed of hardened steel, titanium, or super elastic nickel-titanium.

Piezoelectric patches 32a, 32b bonded to the upper surface 42 and lower surface 44 of substrate 30 respectively are connected by lead wires 46 to energy harvester electronics 47 which receives electricity from piezoelectric patches 32a, 32b during this sudden snapping event. The electricity can be used to drive light emitting diode 48. The energy produced by these harvesters can be stored in one or more capacitors or the energy can be used to charge and re-charge thin film batteries, such as those available from Infinite Power Solutions (Golden, Colo.). The battery may be located within electronics enclosure 49. Once enough energy has been stored, smart electronics modules, such as those described in the commonly assigned '693 patent, allow the load to draw from this energy store to perform a task. These tasks may include sampling of sensor data, storage of sensor data, sending data over a wireless link to another location, receiving data or instructions from another location, and/or storing and forwarding information to another location.

Piezoelectric patches 32a, 32b bonded to either side of substrate 30 produce large voltage pulses that may exceed 200 volts each time the sudden shape change snapping event occurs. As described in the '943 patent, Capacitive Discharge Energy Harvesting (CDEH) converters are especially well suited for use with mechanical energy harvesting elements that receive energy from high voltage piezoelectric materials. In one embodiment significant charge is accumulated within the piezoelectric material itself, improving efficiency. In another embodiment, the voltage threshold upon which energy is released from the piezoelectric and into the energy storage elements of the circuit may be adjusted to take advantage of the voltage provided by the piezoelectric in actual operation.

The present applicants used a CDEH circuit, as described in the '943 patent, to efficiently provide the voltage required by LED 48. In one experiment, applicants combined the sudden pulse of energy from bonded piezoelectric patches with a CDEH circuit to light up a blue LED with every pulse. Preliminary measurements using a digital storage oscilloscope indicated that the energy generated from piezoelectric patches 32a, 32b exceeded 12 microJoules per pulse.

The energy provided by multiple pulses from piezoelectric patches 32a, 32b and a CDEH circuit can be stored and used to power a wireless sensing node and a radio frequency (RF) communications module, such as an SG-LINK from MicroStrain, Inc. (Williston, Vt.). In preliminary experiments, the present applicants found that approximately 20 seconds of cycling at roughly 2 Hz generated sufficient energy to allow the SG-LINK to sample a 1000 ohm strain gauge and to transmit these data along with a unique radio node identification address (RFID).

Figure 2B:
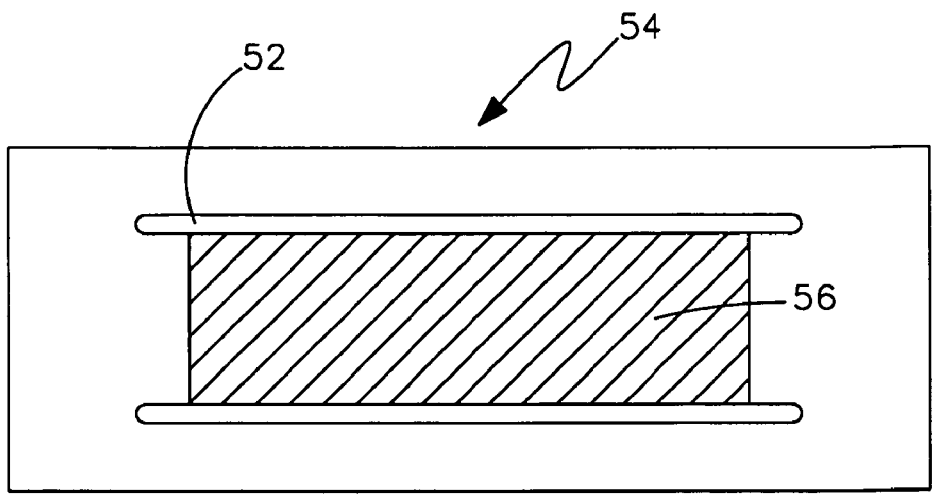
FIG. 2b is a top view of a step in one embodiment of a process for fabricating a wideband energy harvester.
Figure 2C:
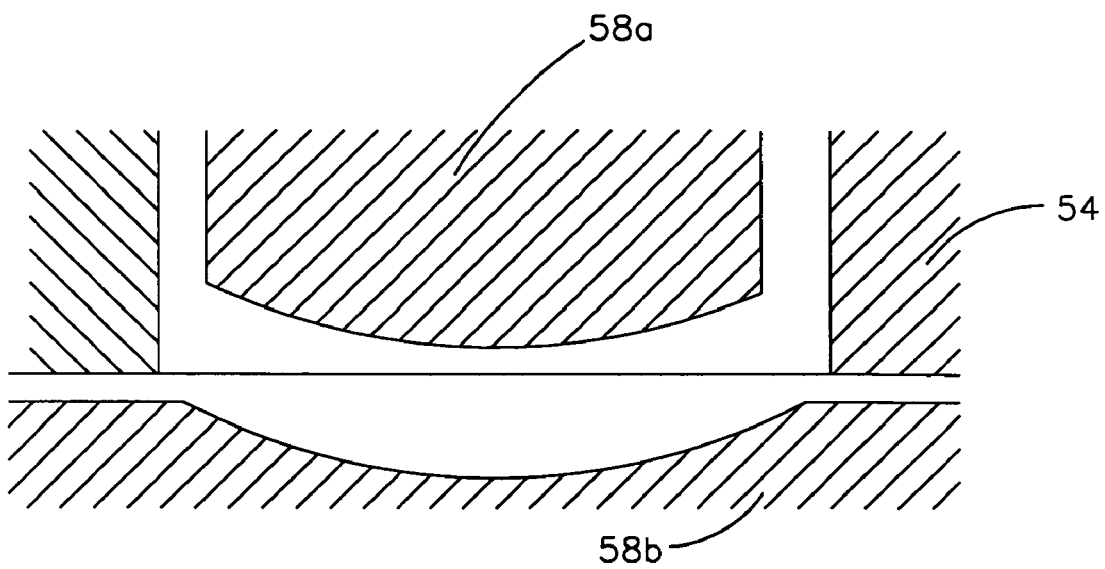
FIG. 2c is a side view of another step in the embodiment of a process of fabricating a wideband energy harvester.

Substrate 30 and length-constraining elements 28 can also be fabricated from a single sheet of material, such as spring steel, as shown in FIGS. 2b, 2c. First, slots 52 are formed in material 54 by a process, such as machining, stamping, chemical etching, or laser cutting. Next, region 56 between slots 52 is lengthened by a process such as pressure from press 58a on rigid hollowed press surface 58b as shown in FIG. 2c, to provide a bowed shape to region 56. The bowed shape permits two stable positions of region 56. Next, piezoelectric patches are bonded to both surfaces of region 56, a mass is added to one end of material 54, and the other end is ready to be clamped to the support structure from which energy will be harvested.

Figure 3:
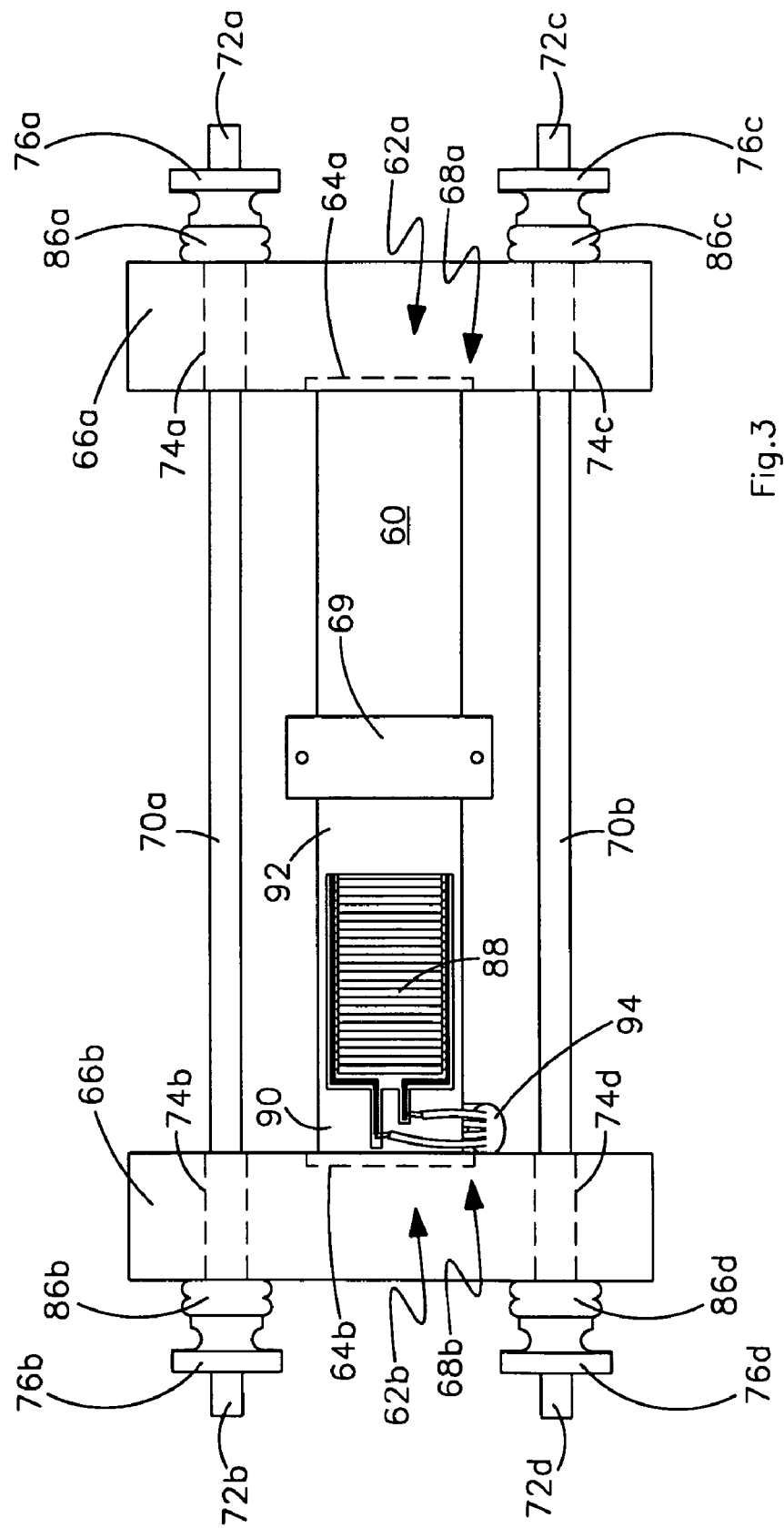
FIG. 3 is another embodiment of a wideband energy harvester with a composite cantilever beam that includes a piezoelectric flexure and length-constraining elements located adjacent the piezoelectric flexure that allow the composite cantilever beam to snap between two stable positions.

Another embodiment of a snap action wideband vibration energy harvester is shown in FIG. 3. Piezoelectric flexure 60 of this embodiment is constrained at both ends 62a, 62b by V-grooves 64a, 64b machined into end blocks 66a, 66b respectively. V-grooves 64a, 64b are designed to receive edges 68a, 68b of long curved piezoelectric flexure 60. Edges 68a, 68b are machined as knife edges to remain in place in V-grooves 64a, 64b while maintaining the capability of piezoelectric flexure 60 to quickly change from convex to concave and vice versa upon loading of mass 69. Loading of curved piezoelectric flexure 60 is from the force generated by the acceleration of mass 69.

Adjustable length rods 70a, 70b have threaded ends 72a, 72b, 72c, 72d that extend through clearance holes 74a, 74b, 74c, 74d in end blocks 66a, 66b. Adjustable length rods 70a, 70b can be shortened or lengthened by changing the position of four threaded fasteners 76a, 76b, 76c, 76d at each threaded end 72a, 72b, 72c, 72d of adjustable length rods 70a, 70b. Shortening of adjustable length rods 70a, 70b compresses piezoelectric flexure 60, causing it to buckle and to have two stable positions. As adjustable length rods 70a, 70b are shortened, piezoelectric flexure 60 curves more and therefore experiences greater strain when snapping between its two stable positions. The shortening of rods 70a, 70b also increases the inertial load required to allow mass 69 to snap piezoelectric flexure 60 from one stable position to the other stable position. Inertial loads applied to mass 69 cause piezoelectric flexure 60 to snap from one to the other of the two distinct stable positions.

The inertial load required to snap piezoelectric flexure 60 may be adjusted by changing the stiffness of springs 86a, 86b, 86c, 86d which are positioned between end blocks 66a, 66b and threaded fasteners 76a, 76b, 76c, 76d. Further adjustments may be made by changing the amount of mass 69 and/or the stiffness of piezoelectric flexure 60. In the embodiment depicted in FIG. 3, end blocks 66a, 66b is fixed relative to the vibrating or oscillating component, machine, or structure and vibrate with that structure. End block 66b is free. An inertial load from the vibration applied to mass 69 causes piezoelectric flexure 60 to snap from one to the other stable position. An applied load, such as from a finger or foot, can also be used, and in this case no mass is needed.

Piezoelectric patches 88 bonded to upper and lower surfaces 90 of substrate 92 provide energy through lead wires 94 to energy harvester electronics module 96. Electrical energy provided may be used to illuminate a light emitting diode or may be stored in a battery which may be located in a compartment within an enclosure along with the electronics that may be located in or connected to end block 66b similar to that shown in FIGS. 1a, 1b and 2.

Figure 4A:
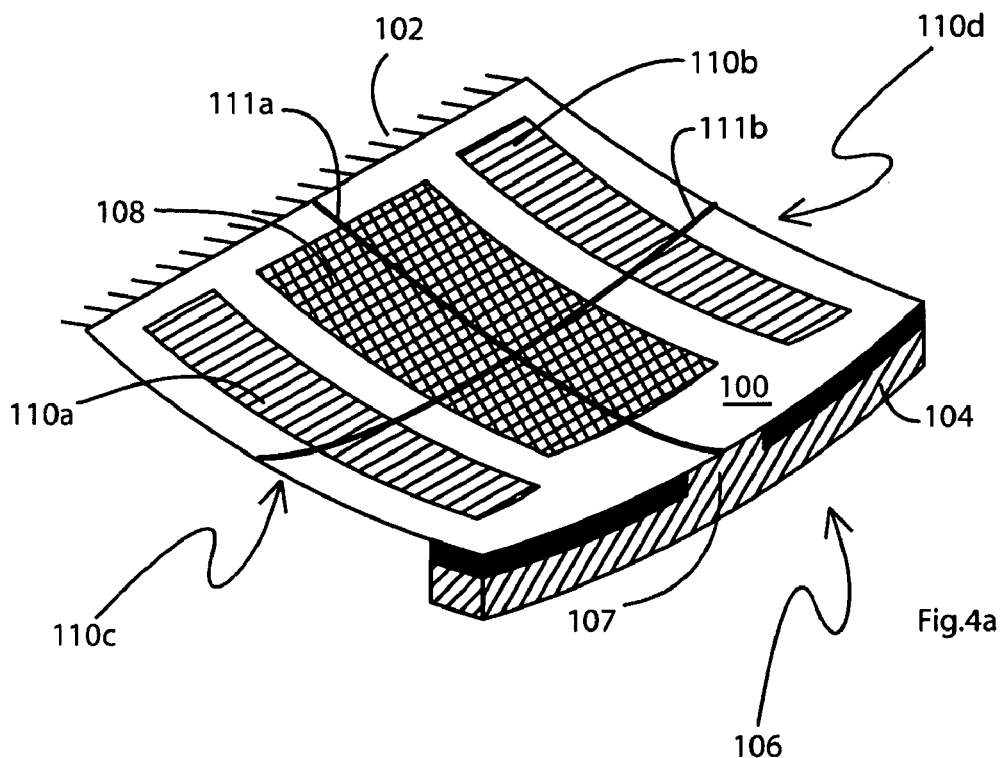
FIGS. 4a, 4b are three dimensional views of another embodiment of a wideband energy harvester with a bowl shaped substrate that allow the substrate to snap between two stable positions.
Figure 4B:
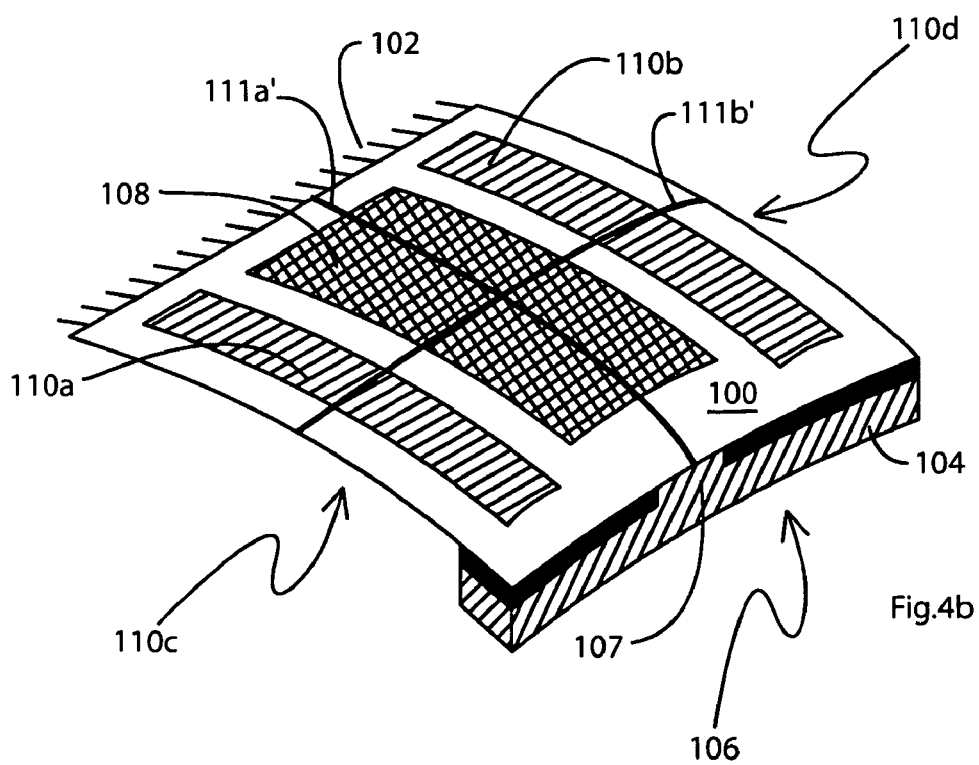

In one embodiment, bowl shaped substrate 100 is bi-stable, as shown in FIGS. 4a, 4b. Bowl shaped substrate 100 can either have a concave bowl shape, as viewed in FIG. 4a, or it can snap to a convex bowl shape, as viewed in FIG. 4b. Substrate 100 is mounted to a support structure at substrate end 102 and has mass 104 mounted to free end 106. Mass 104 is attached in central location 107 allowing substrate 102 to snap from one stable bowl shape to another. Substrate 100 may have center region 108 cut out, facilitating snapping between its two stable positions. Piezoelectric patches 110a, 110b, 110c 110d are bonded to upper and lower surfaces of substrate 100, and these patches generate a pulse of electricity every time substrate 100 snaps between its stable positions.

Bowl shaped substrate is curved in two planes, as shown by curves 111a, 111b of FIG. 4a and curves 111a', 111b' of FIG. 4b.

Figure 5A:
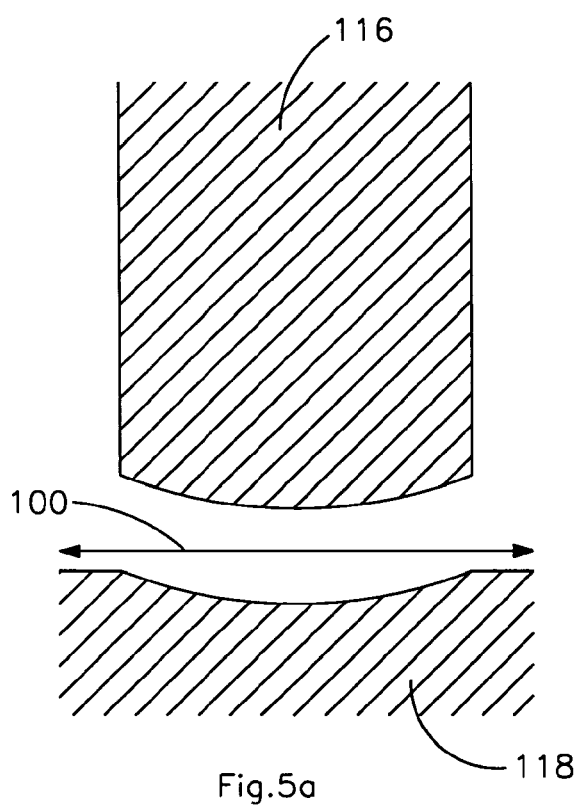
FIGS. 5a, 5b are side and end views of a step in one embodiment of a process for fabricating a bowl shaped wideband energy harvester.
Figure 5B:
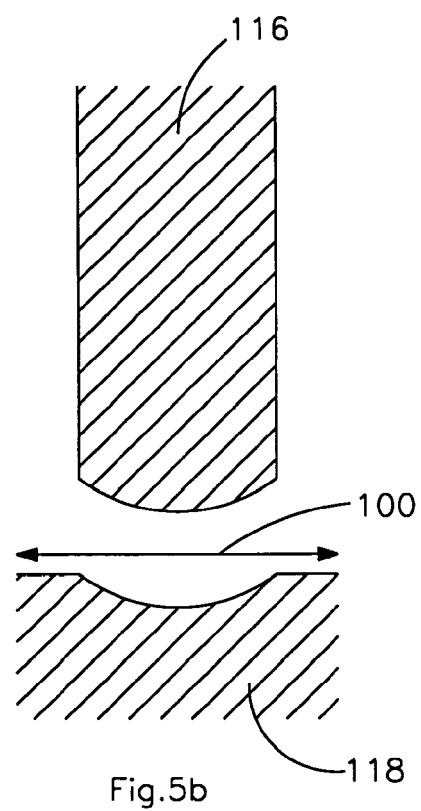

Bowl shaped substrate 100 may be fabricated of a material such as spring steel. Using press 116 that has curvature in two planes, as shown in FIGS. 5a, 5b, spring steel substrate 100 is pressed against rigid form 118 with press 116 to provide substrate 100 with concave curvature in two planes: a bowl shape. With this bowl shaped curvature provided, substrate 100 now can snap between two stable positions, as shown in FIGS. 4a, 4b.

Figure 6A:
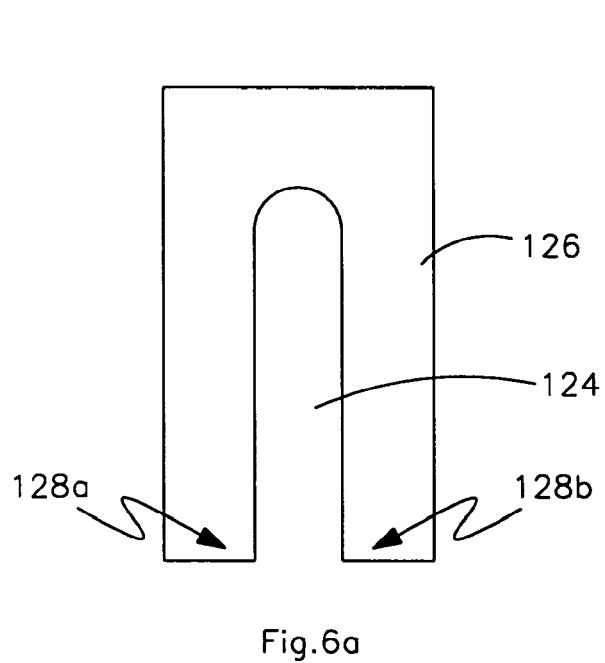
FIGS. 6a, 6b are top views of steps in another embodiment of a process for fabricating a bowl shaped wideband energy harvester.
Figure 6B:
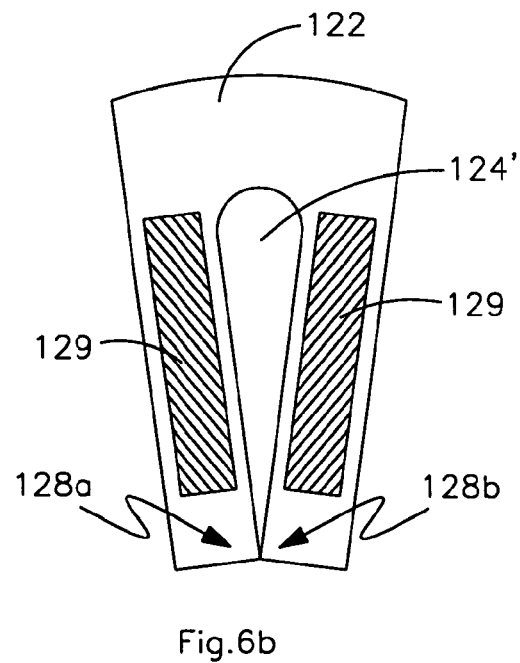

Bowl shaped substrate 122 can also be fabricated by cutting out slot 124 in flat substrate 126, as shown in FIG. 6a. Ends 128a, 128b are then connected together to provide substrate 122 with a bowl shape with tear drop shaped slot 124', as shown in FIG. 6b. Ends 128a, 128b may be connected with a weld or rivet. Piezoelectric patches 129 are bonded to upper and lower surfaces of substrate 122. With this bowl shaped curvature, substrate 122 now can snap between two stable positions, as shown in FIG. 4a, 4b.

Figure 7A:
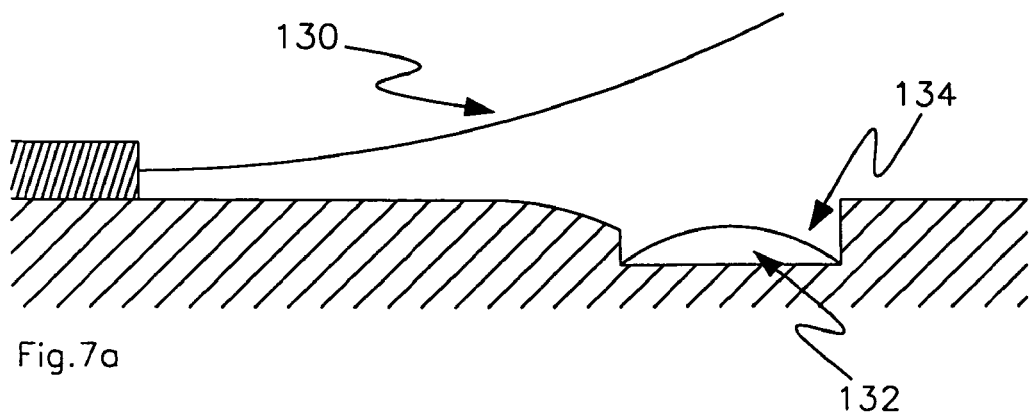
FIGS. 7a-7d are side views illustrating how a bowl shaped wideband energy harvester may be biased so it can be used with a force provided in only one direction.
Figure 7B:
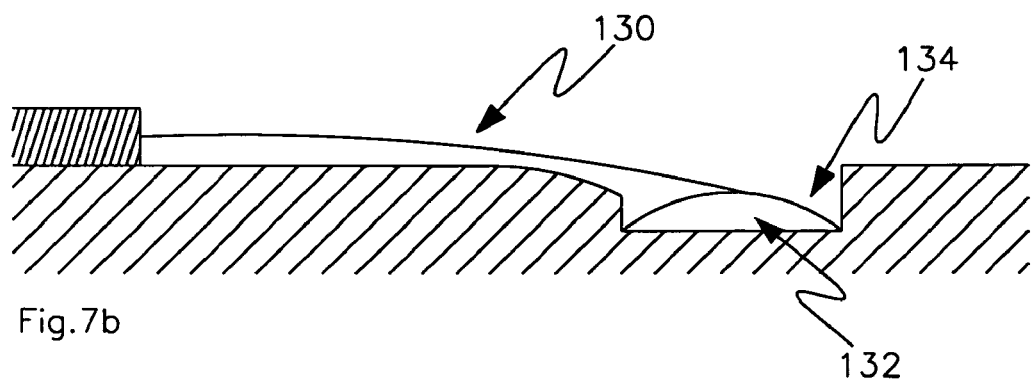
Figure 7C:
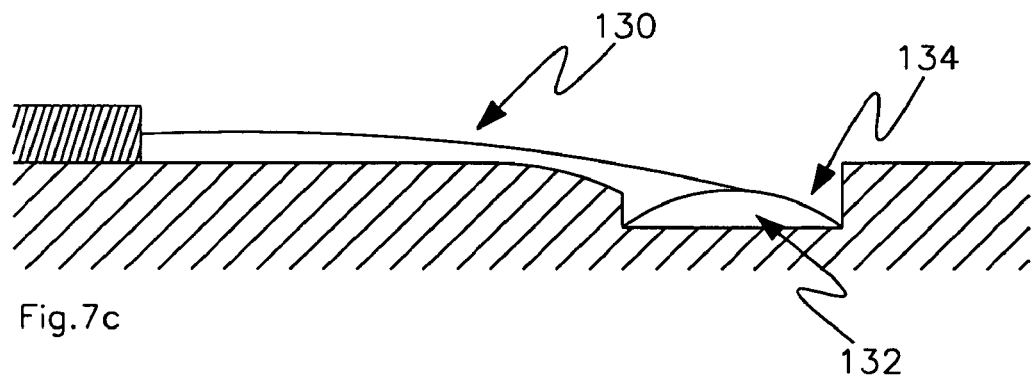
Figure 7D:
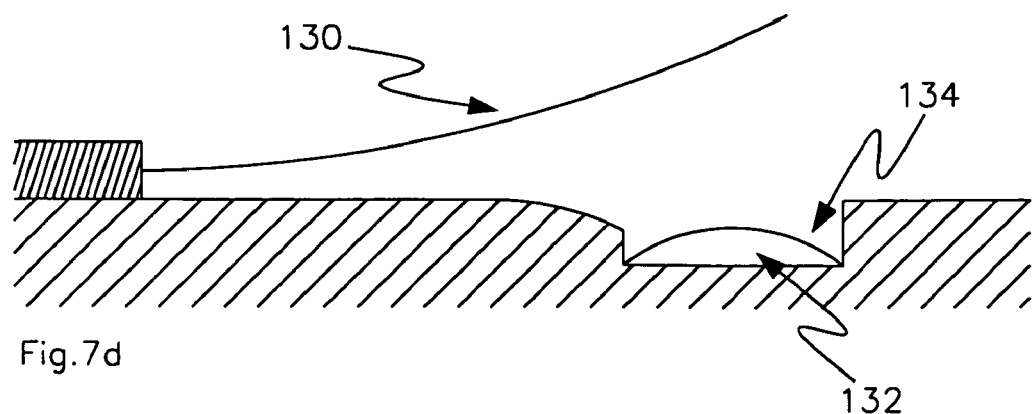

In many uses, energy may be obtained from the bowl shaped piezoelectric flexure so formed when it snaps in each direction. For example, when mounted on a vibrating machine, the vibration may equally force bowl shaped piezoelectric flexure from one stable position to the other and back again to the first due to the inertial load created by acceleration of the mass which is affixed to the bowl shaped piezoelectric flexure. However, in some applications, a force is available primarily in one direction. For example, a force may be provided to piezoelectric flexure 130 by a person's foot primarily in a downward direction when the person is walking, as shown in FIG. 7a, 7b. In this embodiment, after bowl shaped piezoelectric flexure 130 snaps toward stable position 2 from stable position 1, bowl shaped piezoelectric flexure 130 comes in contact with spring 132 located in recessed area 134, as shown in FIGS. 7b-7c, to restore piezoelectric flexure 130 to its ready position between steps when the force is removed, as shown in FIG. 7d. Bowl shaped piezoelectric flexure 130 has bowl shaped stable position 2 when presence of restoring spring 132 is disregarded.

While electricity is generated when piezoelectric flexure 130 snaps in either direction, the substantially greater downward force needed to overcome both the tension in bowl shaped piezoelectric flexure 130 and to generate a restoring spring force means that the mechanical energy in both directions ultimately comes from the stepping action.

Figure 8:
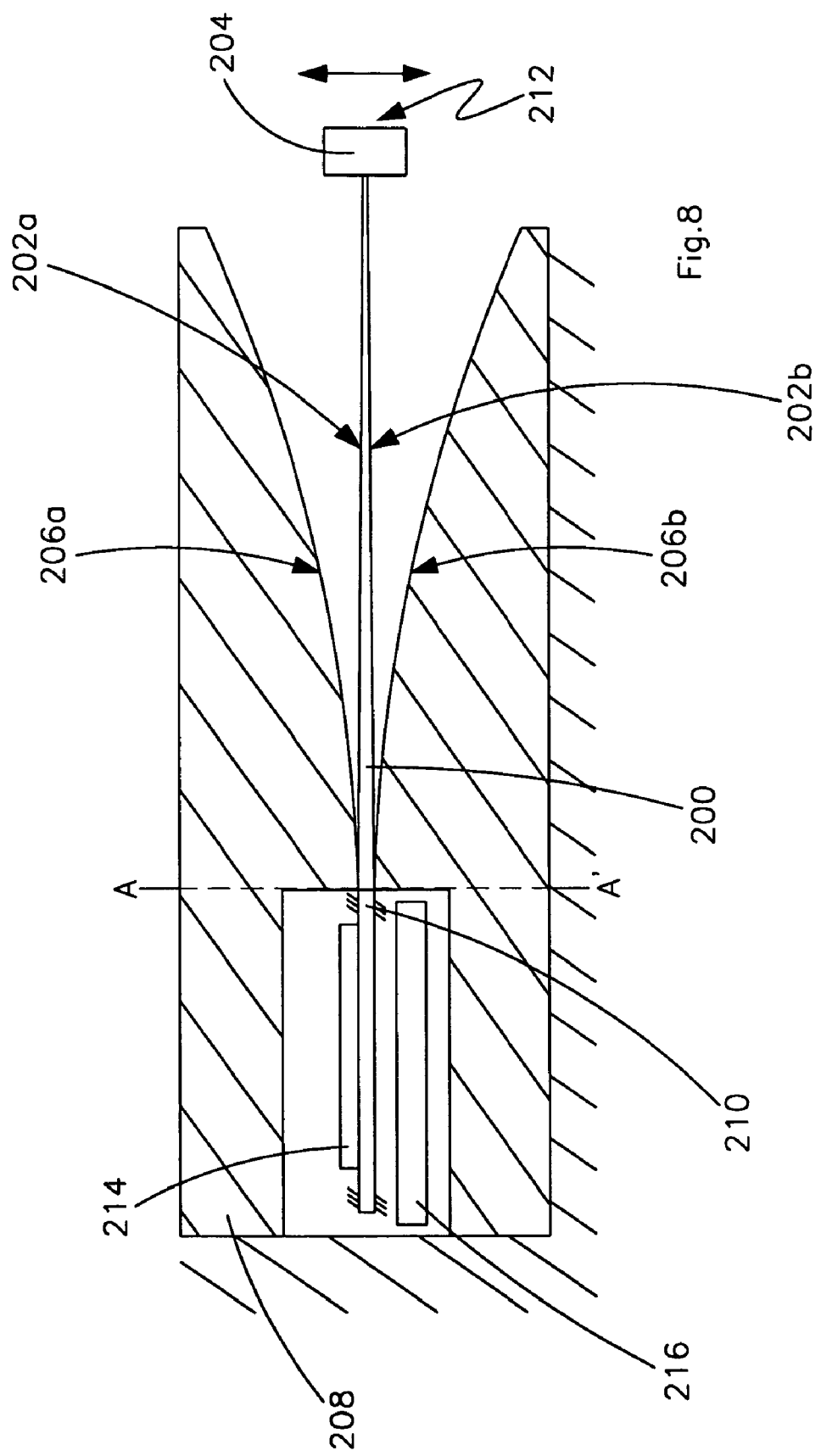
FIG. 8 is an embodiment of a compliant vibration harvester that uses a tapered flexure element and curved overload constraint.

An embodiment of an energy harvesting device that has cantilever beam 200 well protected from overloads, allows cantilever beam 200 to be very compliant, as shown in FIG. 8. Tapered cantilever beam 200 may be constructed of hardened steel, titanium, or super elastic nickel-titanium (Nitinol, Memry Corp). The taper provides a constant strain field in the area where piezoelectric patches 202a, 202b are bonded to the cantilever beam 200, as described in the 115-002 application.

Vibration and/or inertial loads applied to mass 204 cause cantilever beam 200 to move within upper and lower constraints defined by curved surfaces 206a, 206b of housing 208. Curved surfaces 206a, 206b allow cantilever beam 200 to oscillate over a wide range of vibration levels without risk of failure due to fatigue of cantilever beam 200 or damage to piezoelectric patches 202a, 202b bonded to cantilever beam 200. Thus, cantilever beam 200 can be very compliant and cantilever beam 200 will still generate electrical energy without breaking even when vibration amplitude is high.

Cantilever beam 200 is clamped within housing 208 in area 210 and is free to oscillate and vibrate from clamped line A-A' to free end 212. Mass 204 on free end 212 of cantilever beam 200 oscillates due to vibration of the component, machine, or structure to which housing 208 is affixed.

Housing 208 also contains energy harvesting electronic module 214 which is wired to piezoelectric patches 202a, 202b and to a battery in battery compartment 216.

In another embodiment, compliant energy harvesting device 218 provides protection from overloads and provides electrical generation over a wide range of excitation frequencies, as shown in FIG. 9a. Discrete stops 220a, 220b and 222a, 222b provide fulcra around which tapered cantilever beam 224 rotates while limiting the strain experienced by tapered cantilever beam 224, preventing overload. Stops 220a, 220b and 222a, 222b also provide higher frequency resonance points as the effective length of tapered cantilever beam 224 is reduced when it encounters each stop. The reduction in effective length of tapered cantilever beam 224 will be accompanied by an increase in its natural (resonant) frequency as dictated by the following equation for a cantilever beam.

$$Wn^2 = 3EI/l^3$$

Where Wn is the natural frequency of tapered cantilever beam 224, E is its Young's modulus, I is its moment of inertia, and l is its length.

In this embodiment, electrical energy is collected by piezoelectric patches 226a, 226b bonded to the upper and lower surfaces of cantilever beam 224 each time cantilever beam 224 strikes stops 220a, 220b and 222a, 222b.

In one embodiment, wideband energy harvester may include pivot 230 through section A-A'. Pivot 230 may include pinned joint 232, allowing cantilever beam 224 to freely move between stops 220a, 220b and 222a, 222b. Pinned joint 232 can be thinned-down section 234 within cantilever beam 224, as shown in the detail of section A-A' in FIG. 9b. Lead wires 238 emanating from piezoelectric patches 226a, 226b extend along neutral axis 236 of cantilever beam 224, cross over pivot 230, and connect to electronics module 240. Lead wires 238 are coiled in order to prevent fatigue due to cyclic motion in the area of pivot 230.

Pivot 230 introduces an extremely high compliance to rotation of cantilever beam 224. In this energy harvesting system, cantilever beam 224 is unconstrained in all positions, except when it bangs against a stop. Under conditions of vibration or cyclic loading, beam 224 will rock or bang between stops 220a, 220b and 222a, 222b. When beam 224 encounters these stops 220a, 220b and 222a, 222b, strain is created in piezoelectric 226a, 226b which in turn generates energy that is harvested by electronics module 240.

Harvesting energy with energy harvesting device 218 with pivot 230 begins when enough vibration amplitude is present to cause the mechanically unstable mass 246 to oscillate and thereby cause cantilever beam 224 to cycle between the two mechanically stable end stop positions 220a, 220b and 222a, 222b. Because pivot 230 is designed to be extremely compliant torsionally, mass 246 will move under conditions of low frequency vibration as well as higher frequencies. As shown, pivot 230 has a very thin section within cantilever beam 224. This thin section can be machined or formed with a press, allowing pivot 230 to act as a pinned joint that little resists rotation of cantilever beam 224.

Compliant energy harvesting device 218 can be optimized for a given application by adjusting the compliance of pivot 230, the length of cantilever beam 224, the position of stops 220a, 220b and 222a, 222b relative to pivot 230, and the compliance of stops 220a, 220b and 222a, 222b.

Compliant wideband energy harvesting device 218 can be mounted in any position. For example, it can be mounted in a vertical orientation relative to gravity, so that mass 246 hangs downward like a pendulum, with pivot 230 located above mass 246. In this orientation, side to side motion of the component, structure, or machine to which housing 248 is affixed will cause cantilever beam 224 to encounter stops 220a, 220b and 222a, 222b and generate energy.

Alternatively, pivot 230 and cantilever beam 224 may be located below mass 246. Cantilever beam 224 will have stable positions when resting against stops 220a, 220b and 222a, 222b. In this case, two very compliant springs 244 may used to maintain cantilever beam 224 and its mass 246 in a midline relative to stops 220a, 220b and 222a, 222b under conditions of no vibration, as shown in FIGS. 10a, 10b.

Cantilever beam 224 can also be mounted in a horizontal orientation, as shown in FIG. 9a. In this case, a single light spring 244 may be used to counteract the moment created by the weight of mass 246. One end of spring 244 would be connected to cantilever beam 224 and the other end to housing 248. Spring 244 would be placed so that cantilever beam 224 will remain in a mid position under conditions of no vibration. When placed in a vibrating environment, cantilever beam 224 will move rapidly between the stops 220a, 220b and 222a, 222b, resulting in strain in cantilever beam 224 and in piezoelectric patches mounted to cantilever beam 224, which generates energy which is harvested by the electronics module.

The energy harvesting devices of the present application can be used for radio frequency identification tags for tracking inventoried items, pallets, components, subassemblies, and assemblies. With the energy harvesting devices described herein, consumable batteries would no longer be needed for operation, and all energy could be derived from movement or from a direct force input, such as a push button snap action switch. The push button switch generates energy by direct application of force to snap the beam from one curved shape to another curved shape.

The energy harvesting devices can also be used in shoes for children, runners, and bicycle riders to provide electrical energy. For example the shoes may include a light that lights up or flashes when subject to direct pressure from walking, or from the changing inertial load of running, thereby making the wearer more visible to vehicles and increasing the safety of the wearer.

Toys, such as a handheld shaker that lights up when shaken, also could be used with the energy harvesting device of the present application. All energy could be derived from mechanical movement, such as shaking.

A wireless switch also could be used with the energy harvesting device of the present application that in which pressing the button of the switch provides a force that causes the bi-stable element to snap, generating enough electrical energy to wirelessly transmit an RFID signal. When received by a processor, the processor switches a relay that controls a light or any other device.

The energy harvesting device of the present application can also be mounted on a fishing lure such that sufficient energy is harvested to light up an LED when the lure is moved through the water.

The energy harvesting device of the present application can also be mounted on a rotating part, such as a drive shaft, for powering sensors that sample and store the operating load of the drive shaft, and that record its loading history.

The energy harvesting device of the present application can also be mounted on a structure or vehicle, such as an airframe, earth moving equipment, a bridge, dam, building, or other civil structure for powering sensors that sample and store operating strain, and/or loads and record strain and/or loading history. Networks of such wireless energy harvesting nodes may be deployed as appropriate in order to gain insight and knowledge about the overall behavior of the structure or vehicle.

In each of the above applications a battery can be used for storing energy harvested by the energy harvesting device, and the batteries can be automatically recharged without user intervention or maintenance.

Figure 11A:
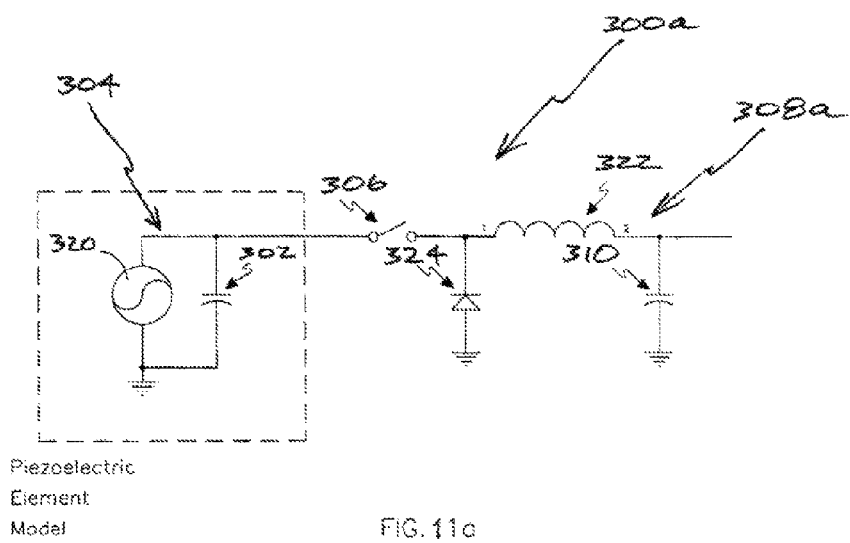
FIGS. 11a, 11b are embodiments of circuits derived from commonly assigned U.S. patent application Ser. No. 12/009, 945 that take advantage of intrinsic capacitance of a piezoelectric device and that provide this storage at the high voltage of the device through a rectifier and a voltage dependent switch to an inductor and capacitor network.
Figure 11B:
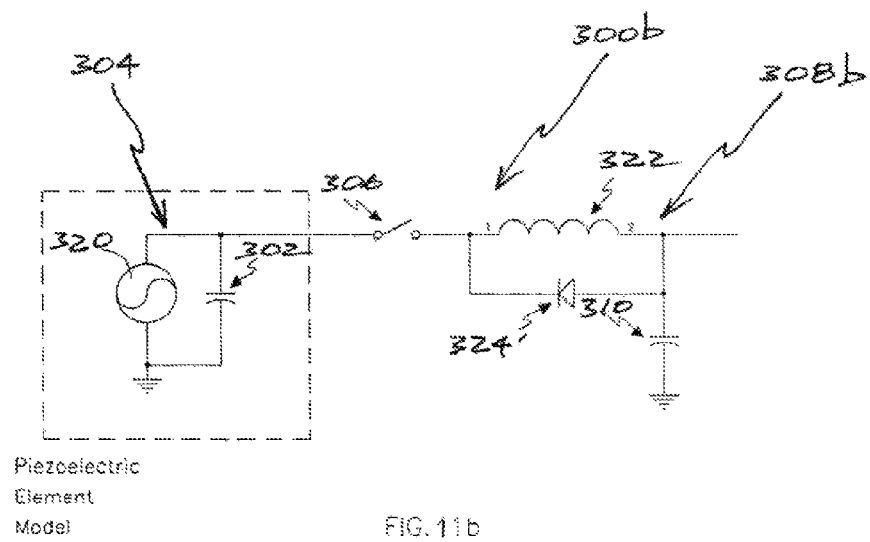

As described in commonly assigned U.S. patent application Ser. No. 12/009,945 ("the '945 application"), the present applicants designed circuit 300a, 300b that substantially improves energy conversion efficiency, as shown in FIGS. 11a, 11b that are derived from that patent application. Circuits 300a, 300b take advantage of intrinsic capacitance 302 of piezoelectric device 304 to store charge generated from mechanical strain or vibration, providing this storage at the high voltage of the piezoelectric device and eliminating loss from charging another potentially mismatched capacitor. One side of piezoelectric device 304 is connected to ground. Diodes provide a positive polarity to the entire electrical signal generated from the back and forth movement of the piezoelectric device. Once a threshold voltage has been reached voltage dependent switch 306 in the circuit rapidly discharges that stored charge through a rectifier and through a high speed switch to inductor and capacitor network 308a, 308b that converts to a lower DC voltage suitable for use powering electronic circuits. Because the entire charge on intrinsic capacitance 302 of piezoelectric device 304 is rapidly discharged no oscillator is needed for this DC-DC conversion. Eliminating the oscillator removes an important source of power consumption while maintaining a high efficiency energy transfer.

Unlike previous converter designs, in the present embodiment, when switch 306 is off piezoelectric device 304 is not substantially loaded, and is disconnected from almost all sources of loss. Thus, its voltage can rise quickly to a high value when mechanical energy is applied to piezoelectric device 304. Only when the voltage across piezoelectric device 304 has risen to the threshold of voltage dependent switch 306, and voltage dependent switch 306 turns on, is energy first drawn from piezoelectric device 304 to ultimately charge storage capacitor 310. A battery can be used in place of or in addition to capacitor 310. Threshold is chosen to be slightly less than the expected open circuit voltage for expected mechanical excitations. In one embodiment threshold was set to 140 volts. In previous designs, such as the embodiments described in the '693 patent, current was drawn from the piezoelectric device as soon as the generated voltage exceeded the two diode forward drops of the full wave rectifier plus the voltage from charge already stored in the storage capacitor from previous energy conversions. These previous designs wasted energy because they did not allow voltage to rise to a high value. By contrast, in the circuit of FIGS. 2a, 2b of the '945 application, by delaying transfer of charge until the threshold voltage is reached, the present circuit design can achieve substantially higher energy conversion efficiency. The threshold voltage is set to be slightly less than the expected open circuit voltage to achieve greatest efficiency.

Energy stored in a capacitance can be described as $$E = \tfrac{1}{2} C V^2$$

where C is the capacitance, and V is the voltage across the capacitance. Because the energy stored depends on the square of the voltage, high voltage type piezoelectric materials provide substantial advantage. However, the high voltage and high impedance of such materials also introduces difficulty in converting to the low voltage and low impedance needed by typical electronic circuits. By using intrinsic capacitance 302 of piezoelectric device 304 instead of providing a separate capacitor, as in the '693 patent, the present inventors found a way to retain the high voltage and high impedance through this first stage of charge storage, significantly improving energy conversion efficiency.

Piezoelectric device 304 is modeled as generator 320 with intrinsic capacitance 302 in parallel, as shown in FIGS. 11a, 11b. As mechanical energy is applied to piezoelectric device 304 on its dependent axis, intrinsic capacitance 302 is charged to a voltage proportional to the applied mechanical energy. One embodiment, further described herein below, provides that when the voltage on capacitance 302 reaches a preset threshold, switch 306 closes, allowing the charge on capacitance 302 to flow into inductor 322. Inductor 322 stores energy in a magnetic field while switch 306 is closed and current is flowing from intrinsic capacitor 302 in piezoelectric device 304. When intrinsic capacitor 302 has discharged to a second threshold voltage, voltage dependent switch 306 opens, current through inductor 322 decreases rapidly, and this magnetic field around inductor 322 collapses. The second threshold voltage may be set to provide for nearly complete discharge of intrinsic capacitor 302. The rapid reduction in current and rapid collapse of the magnetic field when switch 306 opens induces a voltage across inductor 322 according to the equation $$V = L\, Di/DT$$

This induced voltage across inductor 322 provides a current through diode 324, 324' charging large storage capacitor 310. This voltage across storage capacitor 310 is substantially lower than the voltage across piezoelectric device 304. A correspondingly higher charge is stored on capacitor 310.

Figure 12A:
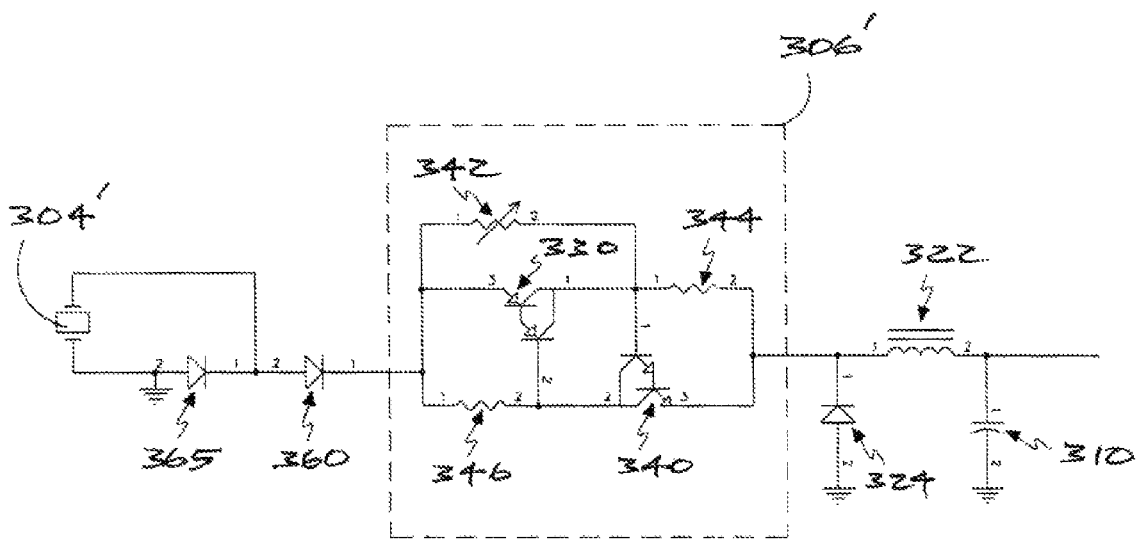
FIGS. 12a, 12b show more detailed embodiments of the circuits of FIGS. 11a, 11b.
Figure 12B:
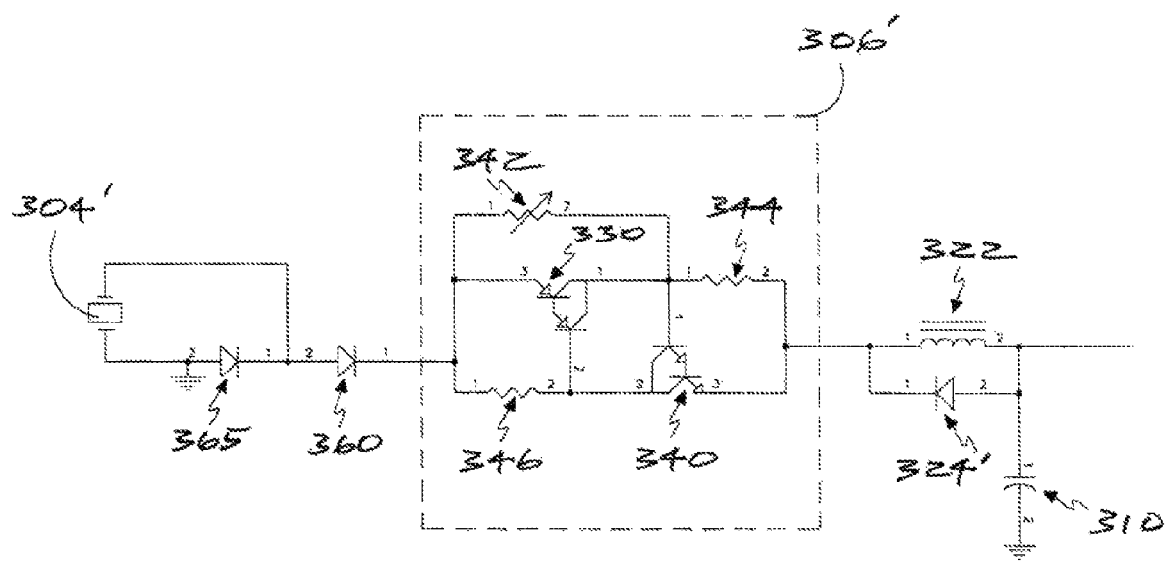

The present applicants designed an efficient voltage dependent switch with very low off state leakage current and a very low on state resistance to enable operation of this circuit, as shown in FIGS. 12a, 12b that are derived from the '945 application. Because piezoelectric device 304, 304' voltage dependent switch 306, 306' and inductor 322 are all in series, leakage current through voltage dependent switch 306, 306' does not detract from the efficiency of the circuit. Leakage current just goes to charge storage capacitor 310.

To operate most efficiently, switch 306, 306' closes at a first threshold when the voltage on intrinsic capacitance 302 is slightly less than the expected maximum open circuit voltage piezoelectric device 304, 304' will attain for the mechanical energy input. Switch 306, 306' later opens at a second threshold when intrinsic capacitance 302 is nearly discharged. Switch 306 has been designed to attain a very low resistance quickly when closed to avoid resistive losses. It also has a very high resistance when open, allowing very little leakage current.

The more detailed embodiment of the circuit of FIGS. 11a, 11b shown in FIGS. 12a, 12b includes voltage dependent switch 306' that includes Darlington transistors 330 and 340. Each of these transistors needs only micro-ampere base currents to turn on, and the Darlington arrangement provides a very high gain. The two Darlington transistors 330 and 340 are arranged in the circuit so that the turning on one causes the other to also turn on and vice versa. The two Darlington transistors 330, 340 remain latched up until intrinsic capacitance 302 of piezoelectric element 304' has nearly discharged and the voltage provided from intrinsic capacitance 302 has declined to close to zero. At that point Darlington transistors 330 and 340 turn off and reset for the next time charge is available from piezoelectric device 304'. P.P. Darlington transistor 330 has part number FZT705 and NPN Darlington transistor 340 has part number FZT605. Both are available from Exodus, Manchester, UK.

Darlington transistor 340 remains off while the voltage across its base emitter junction 1-3 remains below its 1.2 volt turn on threshold. This voltage is controlled by a voltage divider formed by resistors 342 and 344. In practice, any leakage current through Darlington transistor 330 from collector to emitter adds to the current through resistor 342 and forms part of this voltage divider. When a threshold of approximately 150 volts is provided by piezoelectric device 304' and applied across voltage dependent switch 306', the voltage at transistor 340 base emitter junction, reaches the 1.2 volt turn-on threshold, and transistor 340 turns on. The voltage across resistor 346 and across the base-emitter junction from pins 2-3 of Darlington transistor 330 now also equals at least 1.2 volts, and transistor 330 turns on. This provides a high voltage to the base at pin 1 of Darlington transistor 340, keeping the transistor on. While the two Darlington transistors 330, 340 remain thus latched up, intrinsic capacitance of piezoelectric element 304' is nearly completely discharged into inductor 322 through diode 360. Voltage dependent switch 306' continues to conduct until the intrinsic capacitance of piezoelectric element 304' is nearly completely discharged.

Since voltage dependent switch 306' always turns on at the same threshold voltage, and since the intrinsic capacitance of the piezoelectric device is also a constant, every closure of switch 306' transfers the same amount of energy, independent of the energy of the mechanical event producing it, so long as the energy of the mechanical event is sufficient to reach the threshold.

Rather than using a full wave bridge rectifier as in the embodiments of the '693 patent, one side of piezoelectric device 304' is connected to ground and shunt diode 365 is used to provide that the entire signal from piezoelectric element 304' and its intrinsic capacitance 302 is positive. Thus, the peak voltage provided by piezoelectric element 304' is twice the value that would be provided from the same mechanical excitation applied to a circuit using a full wave bridge rectifier that provides a signal centered at 0 volts.

While this half wave rectifier configuration is desirable for applications where mechanical energy input is cyclic, a full wave bridge rectifier can be used where mechanical energy input is random in frequency or is of unknown direction. With a full wave rectifier, half the voltage is reached but twice as often. Thus, the type of rectifier used determines both the magnitude of the voltage achieved and how often the switch fires.

As described in the '505 patent, and referring to FIGS. 13 and 14 of that patent:

As shaft 117 spins, coils 116 mounted on shaft 117 spin as well. As each coil moves through the field produced by permanent magnet 118a that coil experiences a changing magnetic field. The changing field experienced by each coil induces an emf or an electrical pulse in that coil which can be converted to DC power using rectifiers 119 . . . .

Thus, pulses of electricity are generated in coils 116 mounted on shaft 117 from the motion of shaft 117 and coils 116 through a stationary magnetic field, and this energy can then be used to power components mounted on rotating shaft 117 without any electrical connection to shaft 117 . . . . Other than coils, devices such as Weigand wire elements, could be used to generate the emf in place of coils 116.

As described in the '415 patent, and referring to FIGS. 1a and 1b of that patent:

The AC magnetic field can also be generated by a magnet moving relative to coil 82. Such movement may be provided by a vibrating or rotating body in the vicinity of coil 82. This vibration could be produced by an impact event.

While the disclosed methods and systems have been shown and described in connection with illustrated embodiments, various changes may be made therein without departing from the spirit and scope of the invention as defined in the appended claims.

The invention claimed is:

1. A device for harvesting an external source of energy, comprising an electricity generating device, a flexure, and a restoring spring, wherein said electricity generating device generates electricity based on movement of said flexure, wherein said flexure has a first stable position, wherein when disregarding presence of said restoring spring said flexure also has a second stable position different from said first stable position, wherein said restoring spring is positioned so when said flexure snaps from said first stable position toward said second stable position said restoring spring provides a restoring spring force to restore said flexure toward said first stable position, wherein substantially greater force is needed to snap said flexure from said first stable position toward said second stable position to overcome said restoring spring force than is required to snap said flexure from said second stable position toward said first stable position.

2. A device as recited in claim 1, wherein said restoring spring does not apply a force on said flexure until said flexure snaps from said first stable position toward said second stable position.

3. A device as recited in claim 1, wherein said electricity generating device includes a piezoelectric patch and wherein said flexure includes a substrate, wherein said piezoelectric patch is mounted on said substrate to provide a piezoelectric flexure, wherein when said piezoelectric flexure receives a mechanical pulse said piezoelectric flexure moves from said first stable position toward said second stable position and said piezoelectric patch generates a pulse of electricity.

4. A device as recited in claim 3, wherein said piezoelectric patch provides a voltage, further comprising a circuit for reducing voltage provided by said piezoelectric patch.

5. A device as recited in claim 4, wherein said circuit includes a voltage dependent switch and an inductor, wherein said voltage dependent switch is electrically connected between said piezoelectric patch and said inductor.

6. A device as recited in claim 5, wherein said piezoelectric patch, said voltage dependent switch, and said inductor are all electrically connected in series.

7. A device as recited in claim 5, wherein said voltage dependent switch has a first threshold and a second threshold, wherein said second threshold is below said first threshold, wherein said voltage dependent switch remains open until voltage applied across said voltage dependent switch from said piezoelectric patch to said inductor reaches said first threshold, wherein when said voltage applied across said voltage dependent switch reaches said first threshold said voltage dependent switch closes so charge from said piezoelectric patch flows through said voltage dependent switch and through said inductor, wherein when said voltage applied across said voltage dependent switch then falls below said second threshold said voltage dependent switch reopens.

8. A device as recited in claim 7, wherein said voltage dependent switch is a solid state voltage dependent switch.

9. A device as recited in claim 3, wherein said mechanical pulse is a separate individual mechanical pulse.

10. A device as recited in claim 1, wherein said flexure has a bowed shape.

11. A device as recited in claim 1, wherein said flexure has a bowl shape.

12. Canceled A device as recited in claim 1, wherein said flexure includes a piezoelectric patch and a substrate, wherein said piezoelectric patch is mounted on said substrate to provide a piezoelectric flexure.

13. A device as recited in claim 3, wherein said substrate includes a first side and a second side, wherein said piezoelectric flexure includes a first piezoelectric patch mounted on said first side and a second piezoelectric patch mounted on said second side.

14. A device as recited in claim 3, wherein said substrate includes at least one from the group consisting of steel, titanium, and a nickel-titanium alloy.

15. A device as recited in claim 1, wherein said flexure includes a mass.

16. A device as recited in claim 15, wherein if sufficient force is provided to said mass said flexure snaps from said first stable position toward said second stable position.

17. A device as recited in claim 16, wherein said force includes an inertial load.

18. A device as recited in claim 15, wherein said flexure has a first flexure end and a second flexure end, wherein said first flexure end is mounted to said support structure, wherein said mass is located at said second flexure end.

19. A device as recited in claim 18, wherein said second flexure end is unconstrained.

20. A device as recited in claim 1, further comprising at least one from the group consisting of a storage device and an energy using element, wherein said storage device is connected for storing electricity generated by said electricity generating device, and wherein said energy using element is connected for using electricity generated by said electricity generating device.

21. A device as recited in claim 20, wherein said energy using element includes at least one from the group consisting of a light, a sensing node, a wireless communications device, and a processor.

22. A device as recited in claim 1, wherein said electricity generating device is capable of converting vibrational energy into electricity with each movement from said first stable position toward said second stable position at a range of vibration frequencies.

23. A device as recited in claim 1, wherein said flexure has a first flexure end and a second flexure end, wherein said first flexure end is constrained and wherein said second flexure end is unconstrained.

24. A device as recited in claim 1, wherein said flexure remains in said first stable position until a force provided by the external source of energy causes said flexure to move from said first stable position toward said second stable position.

25. A device as recited in claim 1, wherein said flexure has just two stable positions.

26. A device for harvesting an external source of energy, comprising an electricity generating device, a bi-stable flexure, and a restoring spring, wherein said bi-stable flexure has a first stable position, wherein when disregarding presence of said restoring spring said bistable flexure also has a second stable position different from said first stable position, wherein said bi-stable flexure has just said first and said second stable positions, wherein said electricity generating device generates electricity based on movement of said bi-stable flexure, wherein said restoring spring is positioned so when said bi-stable flexure snaps from said first stable position toward said second stable position said restoring spring provides a restoring spring force to restore said bi-stable-flexure toward said first stable position, wherein substantially greater force is needed to snap said bi-stable flexure from said first stable position toward said second stable position to overcome said restoring spring force than is required to snap said bi-stable flexure from said second stable position toward said first stable position.

27. A device as recited in claim 26, wherein said electricity generating device generates electricity based on movement of said bi-stable flexure from said first stable position toward said second stable position.

28. A device for harvesting an external source of energy, comprising an electricity generating device, a flexure, and a restoring spring, wherein said flexure has a first stable position, wherein when disregarding presence of said restoring spring said flexure also has a second stable position different from said first stable position, wherein said electricity generating device generates electricity based on movement of said flexure, wherein said restoring spring is positioned so when said flexure snaps from said first stable position toward said second stable position said restoring spring provides a restoring spring force to restore said flexure toward said first stable position, wherein substantially greater force is needed to snap said flexure from said first stable position toward said second stable position to overcome said restoring spring force than is required to snap said flexure from said second stable position toward said first stable position, wherein said flexure is in a lowest energy state when in said first stable position.

* * * * *